(12) United States Patent
Lin

(10) Patent No.: US 10,629,547 B1
(45) Date of Patent: Apr. 21, 2020

(54) REDISTRIBUTION-LAYER FANOUT PACKAGE STIFFENER

(71) Applicant: Micron Technology, Inc., Boise, ID (US)

(72) Inventor: Jing Cheng Lin, Hsinchu (TW)

(73) Assignee: MICRON TECHNOLOGY, INC., Boise, ID (US)

(*) Notice: Subject to any disclaimer, the term of this patent is extended or adjusted under 35 U.S.C. 154(b) by 0 days.

(21) Appl. No.: 16/174,871

(22) Filed: Oct. 30, 2018

(51) Int. Cl.
| | | |
|---|---|---|
| *H01L 23/48* | (2006.01) | |
| *H01L 23/00* | (2006.01) | |
| *H01L 23/498* | (2006.01) | |
| *H01L 25/00* | (2006.01) | |

(52) U.S. Cl.
CPC ...... *H01L 23/562* (2013.01); *H01L 23/49827* (2013.01); *H01L 23/49866* (2013.01); *H01L 25/50* (2013.01)

(58) Field of Classification Search
CPC ....... H01L 23/16; H01L 23/18; H01L 23/562; H01L 23/49866; H01L 23/49575; H01L 23/49844; H01L 23/3107; H01L 25/50; H01L 2224/023; H01L 2224/0231; H01L 2224/0233; H01L 2224/0237; H01L 2224/20371
See application file for complete search history.

(56) References Cited

U.S. PATENT DOCUMENTS

| | | | |
|---|---|---|---|
| 2018/0261528 A1* | 9/2018 | Chen | H01L 25/0652 |
| 2019/0206807 A1* | 7/2019 | Cho | H01L 23/3675 |

* cited by examiner

*Primary Examiner* — Hsien Ming Lee
(74) *Attorney, Agent, or Firm* — Parsons Behle & Latimer

(57) ABSTRACT

An apparatus may include a packaging substrate. The apparatus may further include multiple semiconductor devices attached to the packaging substrate, the multiple semiconductor devices defining a path along the packaging substrate between a pair of the multiple semiconductor devices. The apparatus may also include a stiffener structure coupled to the packaging substrate and positioned with a longitudinal axis of the stiffener structure being perpendicular to the path.

16 Claims, 5 Drawing Sheets

REDISTRIBUTION-LAYER FANOUT PACKAGE STIFFENER

FIELD

This disclosure related generally to redistribution layer fanout packaging, and in particular to stiffeners uses to reinforce redistribution layer fanout packaging.

BACKGROUND

Packaging semiconductor devices together presents many benefits for streamlining the manufacture of computer processors, memories, and products. In a packaging process, individual semiconductor devices are formed and then coupled with other semiconductor devices to form a system. A packaging substrate may be used to couple the devices to each other. A packaging substrate may include a fanout layer that expands connection sizes from the semiconductor devices to enable connection to larger computing systems. In a typical fanout package assembly, metal layers route connections from devices on a first side of the redistribution layer to connections on a second side of the redistribution layer.

During manufacturing, and thereafter, packaged devices may be subject to forces or pressures as they are assembled into computing devices. In some cases, weak portions of the packages may be vulnerable to breaks during subsequent assembly procedures. Each of the devices attached to the redistribution layer may add structural integrity to the overall package. However, a typical redistribution layer may have still have vulnerabilities between the attached devices. These vulnerabilities may reduce the production rate of functional packaged devices. Other disadvantages may exist.

Figure 1:
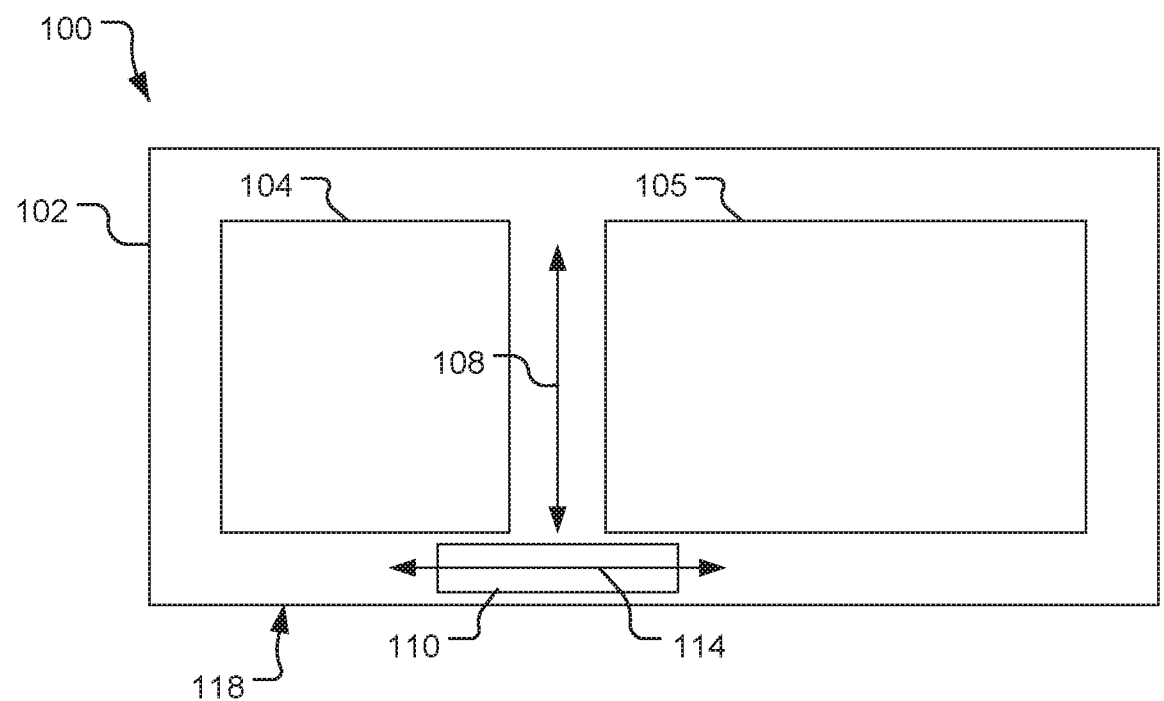
FIG. 1 depicts a top view of an embodiment of a semiconductor package assembly.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may further include one or more device layers deposited on a substrate. A semiconductor device may refer herein to a semiconductor die, but semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor package can also include a substrate that carries one or more semiconductor devices. The substrate may be attached to or otherwise incorporate within the housing or casing.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, semiconductor packages, and methods of making and/or operating semiconductor devices. In one embodiment of the disclosure, an apparatus includes a packaging substrate. The apparatus further includes multiple semiconductor devices attached to the packaging substrate. The multiple semiconductor devices define a path along the packaging substrate between a pair of the multiple semiconductor devices. The apparatus further includes a stiffener structure coupled to the packaging substrate and positioned with a longitudinal axis of the stiffener structure being perpendicular to the path.

Referring to FIG. 1, a semiconductor package assembly 100 is depicted. The assembly 100 may include a substrate 102. The substrate 102 may be a semiconductor device packaging substrate and, in particular, may include a redistribution layer. Although not shown in FIG. 1, the redistribution layer may include copper leads forming a fanout structure.

The assembly 100 may include a first semiconductor device 104 and a second semiconductor device 105. The semiconductor devices 104, 105 may correspond to any devices that may be packaged together, including processors, memory arrays, and/or other types of integrated circuit device components.

The first semiconductor device 104 and the second semiconductor device 105 may define a path 108 along the substrate 102 between the semiconductor devices 104, 105. The path 108 may correspond to an area between the semiconductor devices 104, 105 that is not covered by the semiconductor devices 104, 105. The attachment of the semiconductor devices 104, 105 may provide some additional structural rigidity to the substrate 102 at the portions that are covered by the semiconductor devices 104, 105. However, the area around the path 108 that is not covered by the semiconductor devices may not have the benefit of being strengthened by the attached semiconductor devices.

A stiffener structure 110 may be coupled to the substrate 102. The stiffener structure 110 may have a longitudinal axis 114 that is perpendicular to the path 108. The stiffener structure 110 may include copper, aluminum, silver, another type of conductive material, or a combination thereof. In some embodiments, the material of the stiffener structure 110 may be selected to match a coefficient of thermal expansion of the substrate 102 and or one or more layers positioned within the substrate 102. For example, in cases where the substrate 102 includes a copper fanout structure, the stiffener structure 110 may include copper for coefficient of thermal expansion matching purposes. As such, the coefficient of thermal expansion of the stiffener structure 110 may be substantially equal to the coefficient of thermal expansion of the substrate 102. As used herein, the phrase "substantially equal" means that they are within manufacturing tolerances that are typical and known to persons of ordinary skill in the art. As shown in FIG. 1, the stiffener structure 110 may be positioned proximate to an edge 118 of the substrate 102. As used herein, proximate means that the stiffener structure 110 is as close, or closer to the edge 118 of the substrate 102 than other structures (e.g., the semiconductor devices 104, 105) attached to a surface of the substrate 102.

A benefit of the assembly 100 is that by including the stiffener structure 110, the assembly as a whole may be strengthened, particularly along the path 108. By strengthening between the semiconductor devices 104, 105, fewer breaks, cracks, and/or other failures may occur within the substrate 102. As such, an output of mass produced semiconductor package assemblies may be increased. Other advantages may exist.

Figure 2:
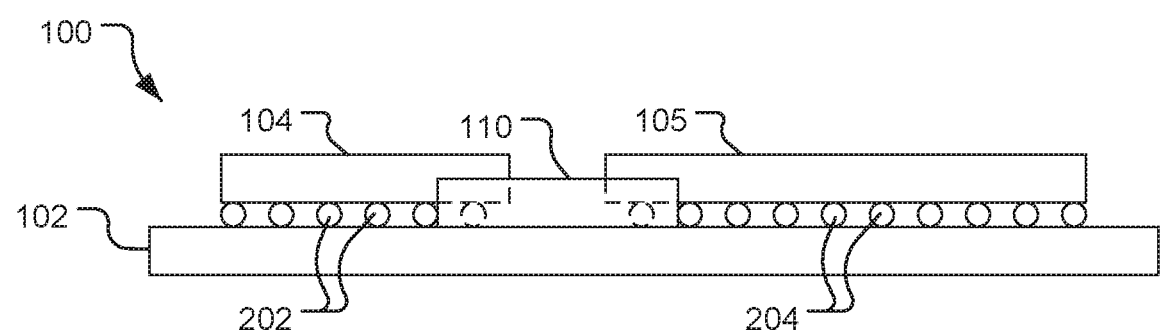
FIG. 2 depicts a side view of an embodiment of a semiconductor package assembly.

Referring to FIG. 2, a semiconductor package assembly 100 is depicted, and may include a substrate 102 with a first semiconductor device 104, and a second semiconductor device 105 coupled thereto. The first semiconductor device 104 may be coupled to the substrate 102 via a first ball-grid-array structure 202. Likewise, the second semiconductor device 105 may be coupled to the substrate 102 via a second ball-grid-array structure 204. Although a ball-grid-array is depicted in FIG. 2, other connection mechanisms may be used. The first semiconductor device 104 may inherently add some structural rigidity to the substrate 102 directly under the first semiconductor device 104. Likewise, the second semiconductor device 105 may inherently add some structural rigidity to the substrate 102 directly under the second semiconductor device 105.

As shown in FIG. 2, a stiffener structure 110 may also be coupled to the substrate 102 in order to provide additional rigidity between the semiconductor devices 104, 105. A length, width, and height of the stiffener structure 110 may be selected to provide a desired balance between rigidity, spacing, and cost effectiveness.

Figure 3:
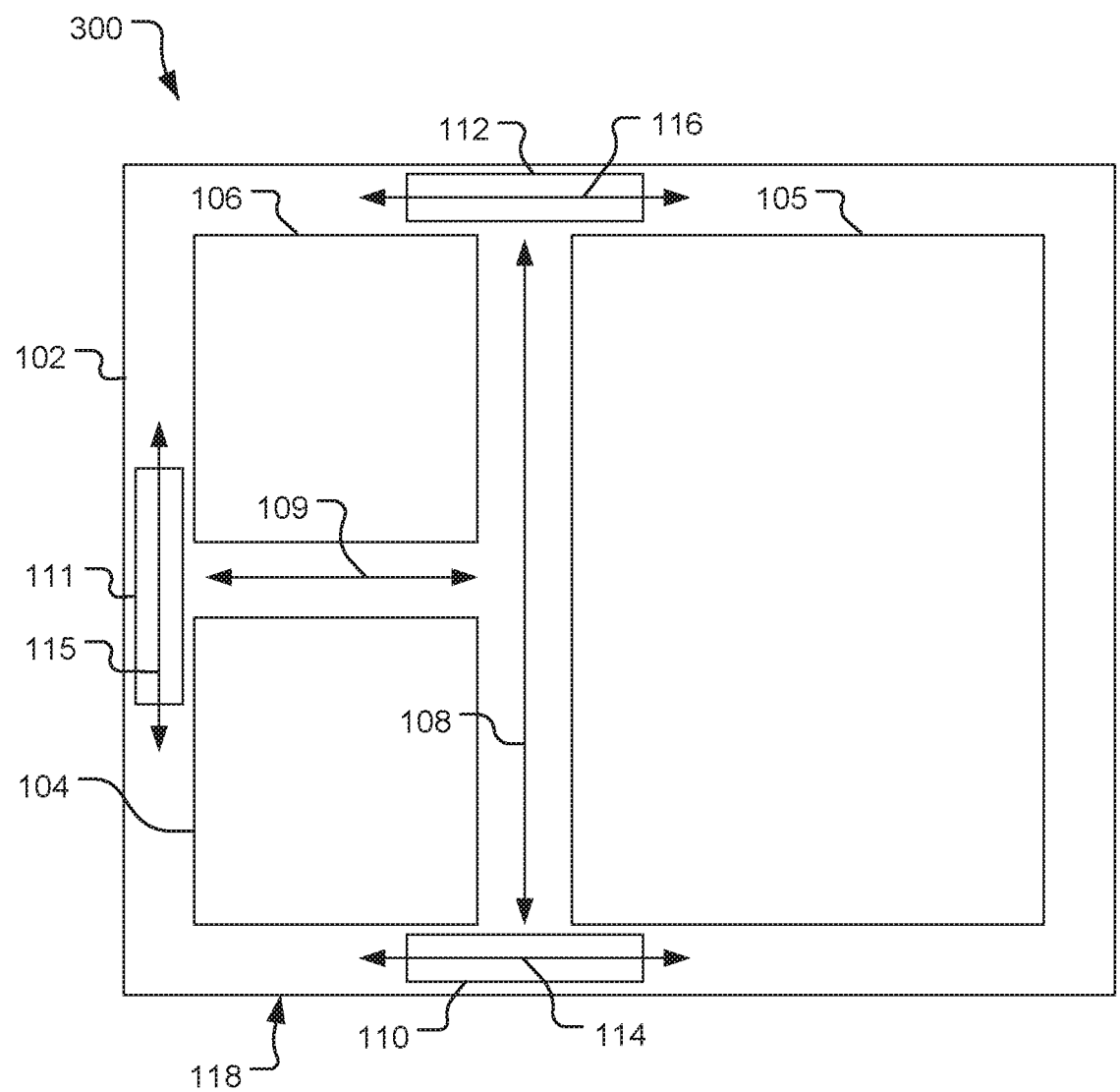
FIG. 3 depicts a top view of an embodiment of a semiconductor package assembly.

Referring to FIG. 3, a semiconductor package assembly 300 is depicted. The semiconductor package assembly 300 may include a substrate 102, a first semiconductor device 104 and a second semiconductor device 105. The semiconductor package assembly 300 may further include a third semiconductor device 106.

A pair of the semiconductor devices 104-106 (e.g., the first semiconductor device 104 and the second semiconductor device 105, or the second semiconductor device 105 and the third semiconductor device 106) may define a first path 108 defined between the pair of semiconductor devices (e.g., either the first and second semiconductor devices 104, 105 or the second and third semiconductor devices 105, 106). Another pair of the semiconductor devices 104-106 (e.g., the first semiconductor device 104 and the third semiconductor device 106) may define a second path 109 between the pair.

The assembly 300 may include multiple stiffener structures 110-112. For example, a first stiffener structure 110 may be positioned proximate to an edge 118 of the substrate 102, having a longitudinal axis 114 perpendicular to the path 108. A second stiffener structure 111 may be positioned having a longitudinal axis 115 perpendicular to the path 109. A third stiffener structure 112 may be positioned having a longitudinal axis 116 perpendicular to the path 108. Other configurations are possible.

A benefit of the assembly 300 is that multiple portions of the substrate 102 may be strengthened by the multiple stiffener structures 110-112. Other benefits may exist.

Figure 4:
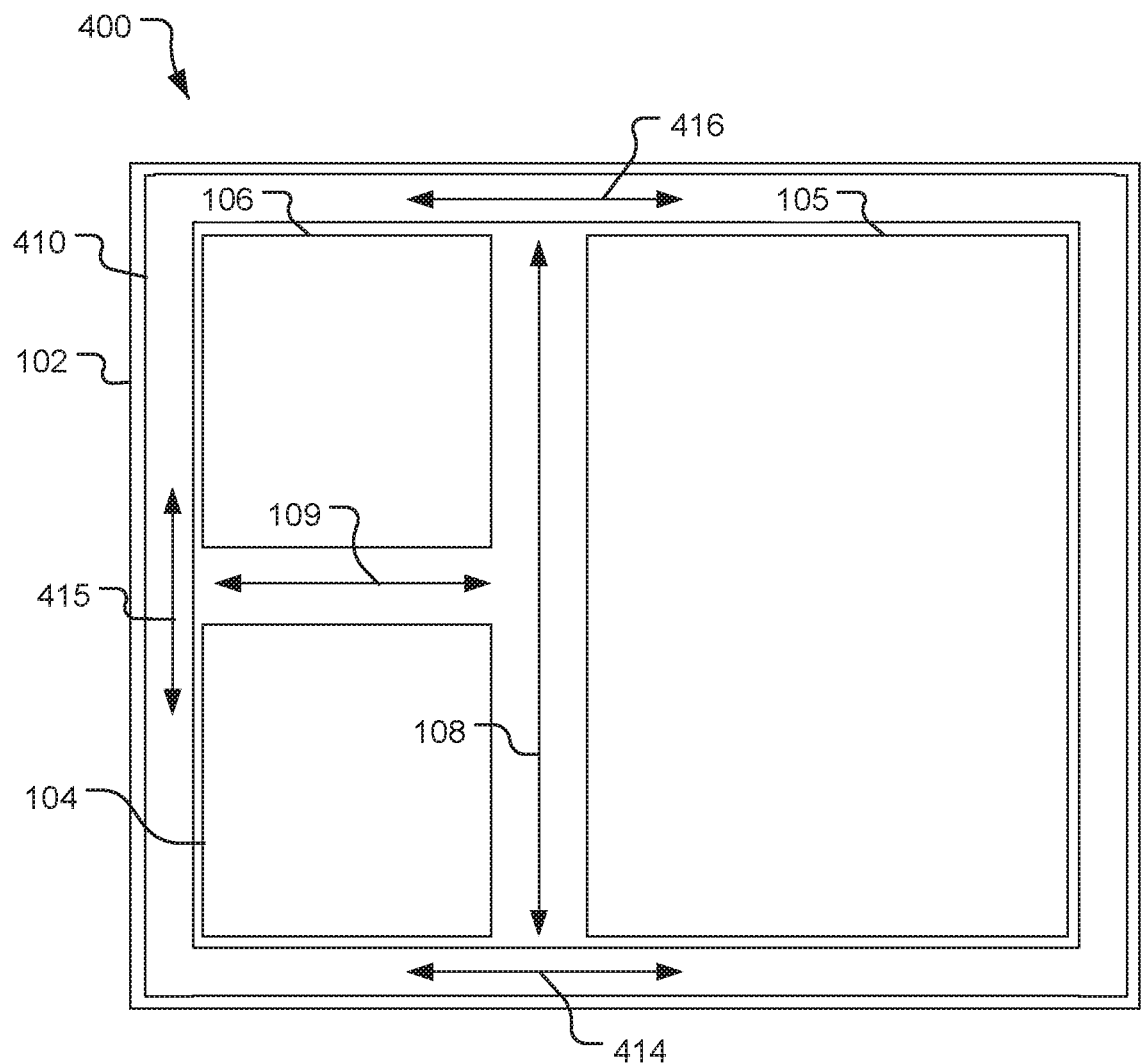
FIG. 4 depicts a top view of an embodiment of a semiconductor package assembly.

Referring to FIG. 4, a semiconductor package assembly 400 is depicted. The assembly 400 may include a substrate 102 with a first semiconductor device 104, a second semiconductor device 105, and a third semiconductor device 106. Instead of having individual stiffener structures, as in FIG. 3, the assembly 400 may include a single stiffener structure that is a frame 410 attached along a border of the substrate 102.

A portion of the frame 410 may have a longitudinal axis 414 that runs perpendicular to a path 108 between the first semiconductor device 104 and the second semiconductor device 105. Another portion of the frame 410 may have a longitudinal axis 415 that runs perpendicular to a path 109 between the first semiconductor device 104 and the third semiconductor device 106. Yet another portion of the frame 410 may have a longitudinal axis 416 that runs perpendicular to the path 108 between the second semiconductor device 105 and the third semiconductor device 106.

The frame 410 may enable the assembly 400 to be manufactured without determining specific points that are to be strengthened. Rather, the entire border of the substrate 102 may be strengthened and made more rigid. Other advantages may exist.

Figure 5:
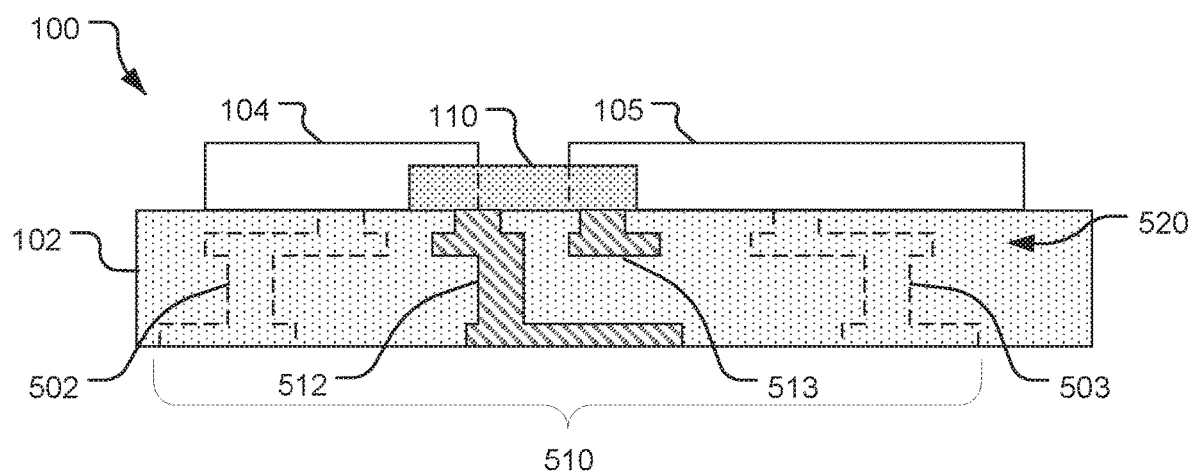
FIG. 5 depicts a cross-section view of an embodiment of a semiconductor package assembly.

Referring to FIG. 5, a cross-section view of a semiconductor package assembly 100 is depicted. FIG. 5 depicts additional details that may corresponding to the substrate 102. For example, the substrate 102 may include a first electrode 502 coupled to the first semiconductor device 104. The substrate 102 may further include a second electrode 503 coupled to the second semiconductor device 105.

It should be understood that the substrate 102 may include many additional electrodes, which have not been shown, creating electrical pathways through the substrate 102 for connecting the package assembly 100 to another device (e.g., a printed circuit board or another type of system board), and for connecting the semiconductor devices 104, 105 to each other. For example, the substrate 102 may be a redistribution layer substrate and the electrodes 502, 503 may correspond to a fanout structure 510 positioned in the substrate 102. In some embodiments, the substrate 102 may include a molding compound 520 within which the electrodes 502, 503 are formed. The electrodes 502, 503 may form part of a copper fanout structure 510. FIG. 5 has been greatly simplified for ease of description. It should also be understood that one or more connection mechanisms (not shown) may be used to couple the semiconductor devices 104, 105 to their respective electrodes 502, 503.

In some embodiments, the stiffener structure 110 may be coupled to a first additional electrode 512 and a second additional electrode 513. In this configuration, the stiffener structure 110 may function as a jumper between electrodes in addition to providing structural rigidity to the substrate 102. A material of the stiffener structure 110 may be selected to match a coefficient of thermal expansion of the fanout structure 510 including the electrodes 502, 503 and including the additional electrodes 512, 513. In some embodiments, the fanout structure 510 is a copper fanout structure and the stiffener structure 110 includes copper. Other materials are possible.

By coupling the stiffener structure 110 to the additional electrodes 512, 513, the stiffener structure 110 may be further anchored to the substrate 102, adding rigidity to the overall structure. Further, the stiffener structure 110 may be used to conduct electrical signals, thereby adding functionality and potentially making the assembly 100 more efficient. Other advantages may exist.

Figure 6:
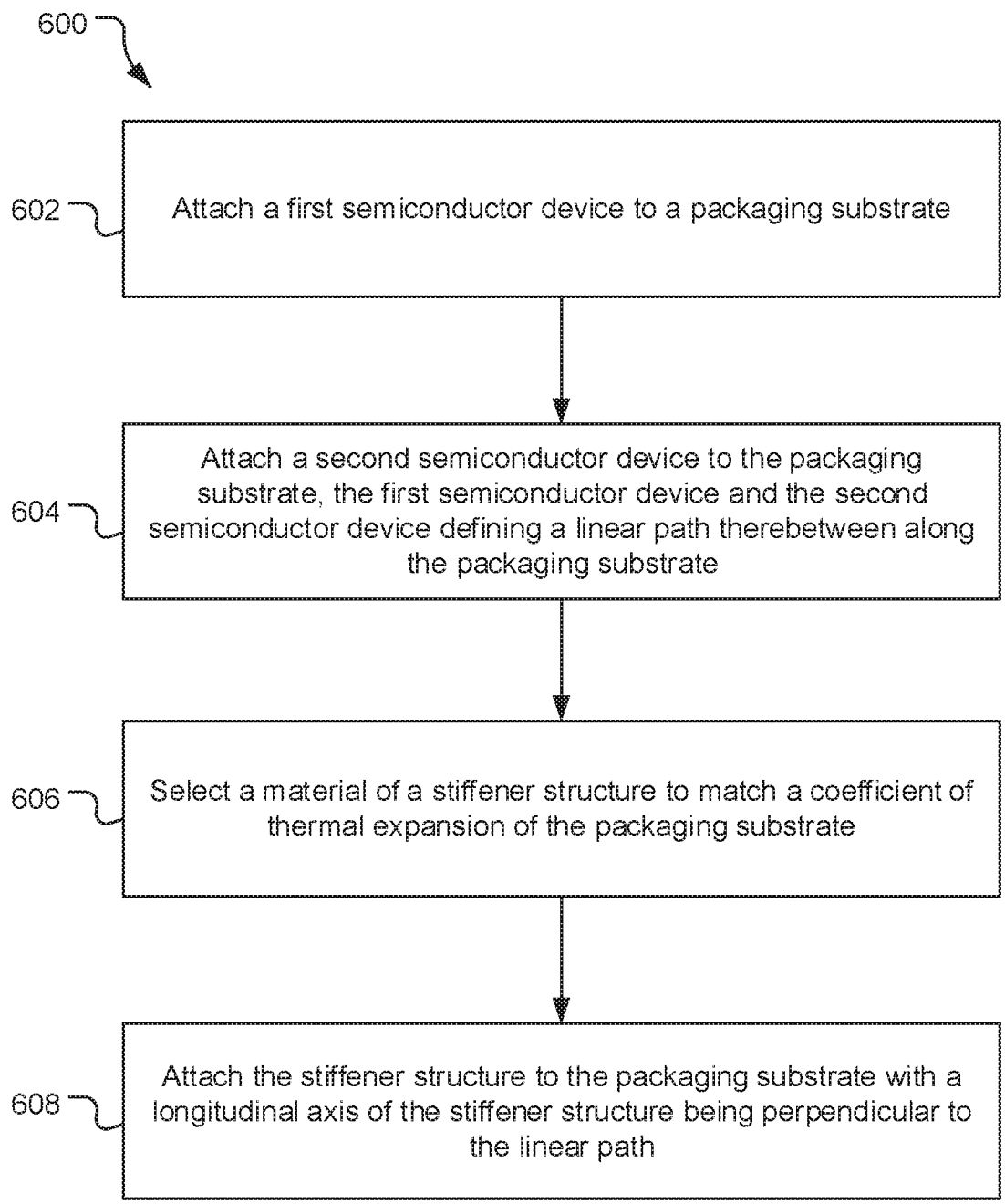
FIG. 6 is a flow chart depicting an embodiment of a method for forming an embodiment of a semiconductor package assembly.

Referring to FIG. 6, an embodiment of a method 600 for forming an embodiment of a semiconductor package assembly is depicted. The method 600 may include attaching a first semiconductor device to a packaging substrate, at 602. For example, the first semiconductor device 104 may be attached to the substrate 102.

The method 600 may further include attaching a second semiconductor device to the packaging substrate, the first semiconductor device and the second semiconductor device defining a path therebetween along the packaging substrate, at 604. For example, the second semiconductor device 105 may be attached to the substrate 102 defining the path 108 therebetween along the substrate 102.

The method 600 may also include selecting a material of a stiffener structure to match a coefficient of thermal expansion of the packaging substrate, at 606. For example, a material of the stiffener structure 110 may be selected to match a coefficient of thermal expansion of the substrate 102 (which may be based on a fanout structure 510 embedded within the substrate 102).

The method 600 may include attaching the stiffener structure to the packaging substrate with a longitudinal axis of the stiffener structure being perpendicular to the path, at 608. For example, the stiffener structure 110 may be attached to the substrate 102 with the longitudinal axis 114 of the stiffener structure 110 perpendicular to the path 108.

A benefit of the method 600 is that a packaging assembly may be constructed with more rigidity between semiconductor devices attached to a packaging substrate than typical packaging assemblies that do not include the stiffener structure 110. Other advantages may exist.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. An apparatus comprising:
   a packaging substrate, wherein the packaging substrate is a redistribution layer, and wherein the redistribution layer includes a copper fanout structure positioned in a molding compound;
   multiple semiconductor devices attached to the packaging substrate, the multiple semiconductor devices defining a path along the packaging substrate between a first pair of the multiple semiconductor devices; and
   a stiffener structure coupled to the packaging substrate and positioned with a longitudinal axis of the stiffener structure being perpendicular to the path.

2. The apparatus of claim 1, wherein the stiffener structure is positioned proximate to an edge of the packaging substrate.

3. The apparatus of claim 1, wherein the stiffener structure is a frame that runs along a border of the packaging substrate.

4. The apparatus of claim 1, wherein the stiffener structure comprises copper, aluminum, silver, or a combination thereof.

5. The apparatus of claim 1, wherein a coefficient of thermal expansion of the stiffener structure is substantially equal to a coefficient of thermal expansion of the packaging substrate.

6. The apparatus of claim 1, wherein the multiple semiconductor devices further define a second path along the packaging substrate between a second pair of the multiple semiconductor devices, the apparatus further comprising a second stiffener structure coupled to the packaging substrate and positioned with a longitudinal axis of the second stiffener structure being perpendicular to the second path.

7. The apparatus of claim 1, further comprising:
   at least one electrode within the packaging substrate coupled to the stiffener structure.

8. A method comprising:
   attaching a first semiconductor device to a packaging substrate, wherein the packaging substrate is a redistribution layer, and wherein the redistribution layer includes a copper fanout structure positioned in a molding compound;
   attaching a second semiconductor device to the packaging substrate, the first semiconductor device and the second semiconductor device defining a path therebetween along the packaging substrate;
   attaching a stiffener structure to the packaging substrate with a longitudinal axis of the stiffener structure being perpendicular to the path.

9. The method of claim 8, wherein the stiffener structure is attached proximate to an edge of the packaging substrate.

10. The method of claim 8, wherein the stiffener structure is a frame attached along a border of the packaging substrate.

11. The method of claim 8, wherein the stiffener structure comprises copper, aluminum, silver, or a combination thereof.

12. The method of claim 8, further comprising selecting a material of the stiffener structure to match a coefficient of thermal expansion of the packaging substrate.

13. The method of claim 8, further comprising:
   attaching at least one additional semiconductor device to the packaging substrate, the at least one additional semiconductor device and the first semiconductor device defining an additional path therebetween along the packaging substrate; and attaching at least one additional stiffener structure to the packaging substrate with a longitudinal axis of the at least one additional stiffener structure being perpendicular to the additional path.

14. The method of claim 8, further comprising:

electrically coupling the stiffener structure to at least one electrode within the packaging substrate.

15. An apparatus comprising:

a redistribution layer substrate having a copper fanout structure positioned in a molding compound;

multiple semiconductor devices attached to the redistribution layer substrate, the multiple semiconductor devices defining a path along the redistribution layer substrate between a pair of the multiple semiconductor devices; and a copper stiffener structure coupled to the redistribution layer substrate and positioned with a longitudinal axis of the copper stiffener structure being perpendicular to the path.

16. The apparatus of claim 15, further comprising:

at least one electrode within the redistribution layer substrate and coupled to the copper stiffener structure.

\* \* \* \* \*